US009224852B2

(12) United States Patent
Guan et al.

(10) Patent No.: US 9,224,852 B2
(45) Date of Patent: Dec. 29, 2015

(54) CORNER LAYOUT FOR HIGH VOLTAGE SEMICONDUCTOR DEVICES

(75) Inventors: Lingpeng Guan, San Jose, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 524 days.

(21) Appl. No.: 13/561,500

(22) Filed: Jul. 30, 2012

(65) Prior Publication Data

US 2014/0027819 A1   Jan. 30, 2014

(51) Int. Cl.
*H01L 29/78*   (2006.01)
*H01L 29/66*   (2006.01)
*H01L 29/40*   (2006.01)
H01L 29/06   (2006.01)
H01L 29/08   (2006.01)
H01L 29/10   (2006.01)

(52) U.S. Cl.
CPC ........ *H01L 29/7811* (2013.01); *H01L 29/0696* (2013.01); *H01L 29/407* (2013.01); *H01L 29/66666* (2013.01); *H01L 29/0623* (2013.01); *H01L 29/0634* (2013.01); *H01L 29/0878* (2013.01); *H01L 29/1095* (2013.01); *H01L 2924/0002* (2013.01)

(58) Field of Classification Search
CPC .................. H01L 21/823487; H01L 29/66272; H01L 29/66666; H01L 29/407; H01L 29/7811
See application file for complete search history.

(56) References Cited

U.S. PATENT DOCUMENTS

| | | |
|---|---|---|
| 3,391,287 A | 7/1968 | Kao et al. |
| 4,158,206 A | 6/1979 | Neilson |
| 4,573,066 A | 2/1986 | Whight |
| 4,648,174 A | 3/1987 | Temple et al. |
| 4,941,026 A | 7/1990 | Temple |
| 5,637,898 A | 6/1997 | Baliga |
| 5,973,360 A | 10/1999 | Tihanyi |
| 5,998,833 A | 12/1999 | Baliga |
| 6,252,288 B1 | 6/2001 | Chang |

(Continued)

FOREIGN PATENT DOCUMENTS

| | | | |
|---|---|---|---|
| CN | 202839620 U | | 3/2013 |
| TW | 201130114 A | * | 9/2011 |

OTHER PUBLICATIONS

Notice of Allowance for U.S. Appl. No. 13/561,523, dated Mar. 14, 2014.

(Continued)

*Primary Examiner* — Joseph C Nicely
(74) *Attorney, Agent, or Firm* — Joshua D. Isenberg; JDI Patent

(57) ABSTRACT

A corner layout for a semiconductor device that maximizes the breakdown voltage is disclosed. The device includes first and second subsets of the striped cell arrays. The ends of each striped cell in the first array is spaced a uniform distance from the nearest termination device structure. In the second subset, the ends of striped cells proximate a corner of the active cell region are configured to maximize breakdown voltage by spacing the ends of each striped cell a non-uniform distance from the nearest termination device structure. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

12 Claims, 5 Drawing Sheets

(56) References Cited

U.S. PATENT DOCUMENTS

| | | |
|---|---|---|
| 6,452,230 B1 | 9/2002 | Boden, Jr. |
| 6,512,268 B1 | 1/2003 | Ueno |
| 6,545,316 B1 | 4/2003 | Baliga |
| 6,762,455 B2 | 7/2004 | Oppermann et al. |
| 6,803,626 B2 | 10/2004 | Sapp et al. |
| 7,291,894 B2 | 11/2007 | Sapp et al. |
| 7,335,944 B2 | 2/2008 | Banerjee et al. |
| 7,335,949 B2 | 2/2008 | Ninomiya et al. |
| 7,393,749 B2 | 7/2008 | Yilmaz et al. |
| 7,649,223 B2 | 1/2010 | Kawashima |
| 8,076,718 B2 | 12/2011 | Takaya et al. |
| 8,575,685 B2 | 11/2013 | Bobde et al. |
| 8,680,613 B2 | 3/2014 | Guan et al. |
| 2005/0098826 A1 | 5/2005 | Yamaguchi et al. |
| 2007/0001194 A1 | 1/2007 | Ono et al. |
| 2007/0001230 A1 | 1/2007 | Lee et al. |
| 2007/0181927 A1 | 8/2007 | Yedinak et al. |
| 2011/0076815 A1* | 3/2011 | Bhalla et al. ............... 438/237 |
| 2011/0204442 A1 | 8/2011 | Guan et al. |
| 2011/0220998 A1* | 9/2011 | Darwish et al. ............. 257/339 |
| 2011/0278650 A1 | 11/2011 | Tamaki et al. |
| 2012/0161274 A1 | 6/2012 | Lee et al. |
| 2013/0049102 A1 | 2/2013 | Bobde et al. |
| 2013/0075809 A1* | 3/2013 | Hsieh ............................ 257/328 |
| 2013/0092976 A1* | 4/2013 | Hsieh ............................ 257/133 |
| 2014/0027819 A1 | 1/2014 | Guan et al. |
| 2014/0027841 A1 | 1/2014 | Bhalla et al. |
| 2014/0193958 A1 | 7/2014 | Guan et al. |

OTHER PUBLICATIONS

U.S. Appl. No. 13/561,300, entitled "Termination Design for High Voltage Device" to Lingpeng Guan, filed Jul. 30, 2012.

U.S. Appl. No. 13/561,523, entitled "High Voltage Field Balance Metal Oxide Field Effect Transistor (FBM)" to Anup Bhalla, filed Jul. 30, 2012.

Onishi, Y.; Iwamoto, S.; Sato, T.; Nagaoka, T.; Ueno, K.; Fujihira, T., "24 mΩcm2 680 V silicon superjunction MOSFET," Power Semiconductor Devices and ICs, 2002. Proceedings of the 14th International Symposium on , vol., No., pp. 241,244, 2002.

Baliga, B.J. Advanced Power MOSFET Concepts. New York: Springer-Science, 2010. 23-61. Print.

Notice of Allowance for U.S. Appl. No. 14/206,480, dated Mar. 6, 2015.

Taiwanese Action for TW Application No. 10420360220, dated Mar. 23, 2015.

Notice of Allowance for U.S. Appl. No. 14/329,776, dated May 22, 2015.

* cited by examiner

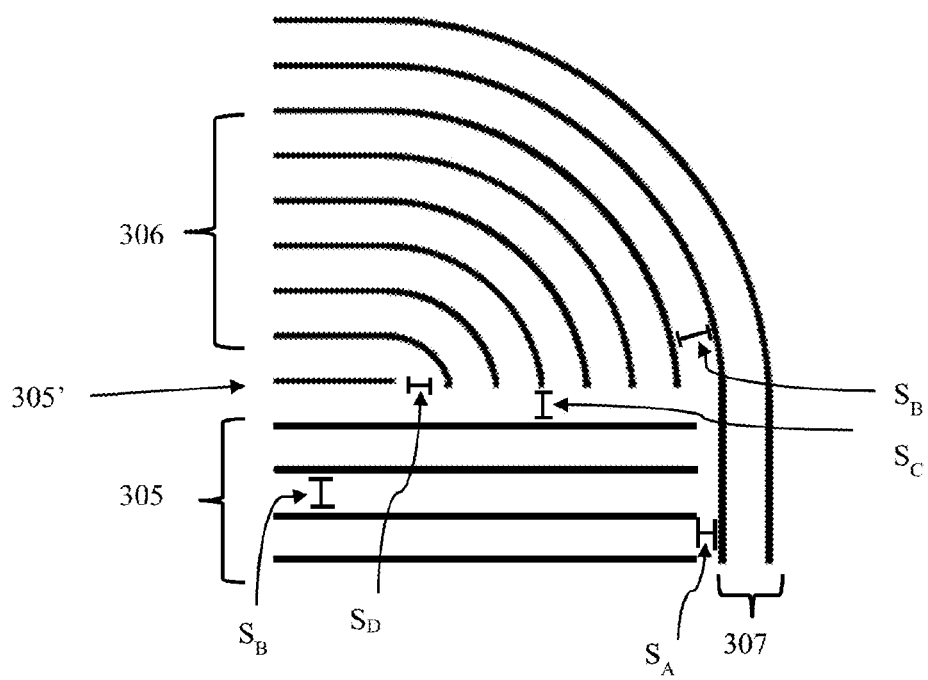
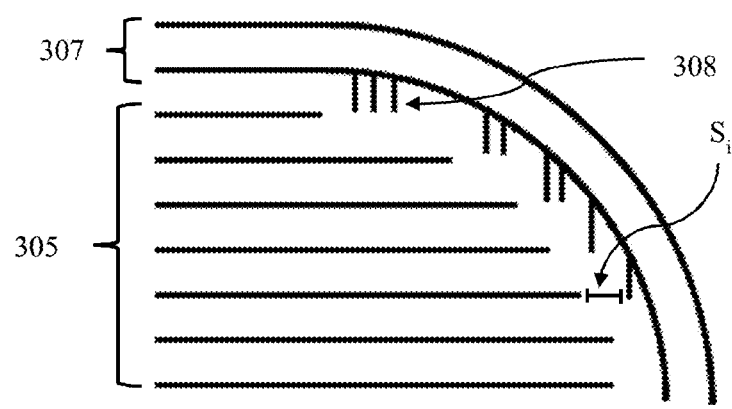

ced herein by reference. FIG. 1A
CORNER LAYOUT FOR HIGH VOLTAGE SEMICONDUCTOR DEVICES

CROSS-REFERENCE TO RELATED APPLICATION

This application is related to commonly-assigned application Ser. No. 13/199,381, filed Aug. 25, 2011, now U.S. Pat. No. 8,575,685, the entire disclosures of which are incorporated herein by reference.

This application is related to commonly-assigned application Ser. No. 13/561,300, entitled "TERMINATION DESIGN FOR HIGH VOLTAGE DEVICE" to Lingpeng Guan et al., filed Jul. 30, 2012, now U.S. Pat. No. 8,680,613, the entire disclosures of which are incorporated herein by reference.

This application is related to commonly-assigned, co-pending application Ser. No. 13/561,523 entitled "HIGH VOLTAGE FIELD BALANCE METAL OXIDE FILED EFFECT TRANSISTOR" to Anup Bhalla et al., filed Jul. 30, 2012, the entire disclosures of which are incorporated herein by reference.

FIELD OF THE INVENTION

Embodiments of the present invention are related to semiconductor power devices. More particularly, this invention relates to new configurations and methods for manufacturing a termination structure for semiconductor transistor devices with trenches or for semiconductor transistor devices that are charge balanced.

BACKGROUND OF THE INVENTION

Conventional technologies to configure and manufacture high voltage semiconductor power devices are still confronted with difficulties and limitations to further improve the performances due to different tradeoffs. In vertical semiconductor power devices, there is a tradeoff between the drain to source resistance, i.e., on-state resistance, commonly represented by $R_{dsA}$ (i.e., $R_{ds}$ X Active Area) as a performance characteristic, and the breakdown voltage sustainable by the power device. A commonly recognized relationship between the breakdown voltage (BV) and the $R_{dsA}$ is expressed as: $R_{dsA}$ is directly proportional to $BV^{2.5}$. For the purpose of reducing the $R_{dsA}$, an epitaxial layer is formed with a higher dopant concentration. However, a heavily doped epitaxial layer also reduces the breakdown voltage sustainable by the semiconductor power device.

The prior art has described many methods for increasing the BV for power MOSFET devices. Examples of the devices include charge balanced devices such as superjunction MOSFETs and surface enhanced devices with trenches such as a field balance MOSFETs (FBMs).

Superjunctions are a well-known type of semiconductor device. Superjunction transistors provide a way to achieve low $R_{dsA}$ while maintaining a high off-state BV. Superjunction devices include alternating P-type and N-type doped columns formed in the drift region. In the OFF-state of the MOSFET, the columns completely deplete at relatively low voltage and thus can sustain a high breakdown voltage (the columns deplete laterally, so that the entire p and n columns are depleted). For a superjunction device, the $R_{dsA}$ increases in direct proportion to the BV. This is a much less dramatic increase than in the conventional semiconductor structure. A superjunction device may therefore have significantly lower $R_{dsA}$ than a conventional MOSFET device for the same high BV (or conversely may have a significantly higher BV than a conventional MOSFET for a given $R_{dsA}$).

Superjunction devices are described, e.g., in "24 mΩcm² 680V silicon superjunction MOSFET", Onishi, Y.; Iwamoto, S.; Sato, T.; Nagaoka, T.; Ueno, K.; Fujihira, T., *Proceedings of the 14th International Symposium on Power Semiconductor Devices and ICs*, 2002, pages: 241-244, the entire contents of which are incorporated herein by reference. FIG. 1A is a cross-sectional view of part of an active cell portion of a conventional superjunction device 100. In this example, the active cell portion of the device 100 includes a vertical FET structure (e.g., an N-channel) formed on a suitably doped (e.g., $N^+$) substrate 102, which acts as a drain region with a drain contact 105. A suitably-doped (e.g., N-Epitaxial (epi) or N-drift) layer 104 is located on top of the substrate 102. In this example, the device 100 also includes a P-body region 106, an $N^+$ source region 108, and an $N^+$ polysilicon gate region 112. The device 100 also includes a gate contact (not shown) and a source metal 114. As seen in FIG. 1A, the superjunction structures may include alternating, charge balanced P-type columns 130 and n-type columns 132. These columns completely deplete horizontally at a low voltage and so are able to withstand a high breakdown voltage in the vertical direction. The N-type columns 132 may comprise of the portions of the n-type epitaxial layer 104 that are situated adjacent to the p-type columns 130.

It is within this context that embodiments of the present invention arise.

BRIEF DESCRIPTION OF THE DRAWINGS

The teachings of the present invention can be readily understood by considering the following detailed description in conjunction with the accompanying drawings, in which:

FIG. 3C is a zoomed in view of the corner layout of the second embodiment of the present invention.

FIG. 3D is a top view of a corner layout for a third embodiment of the present invention

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
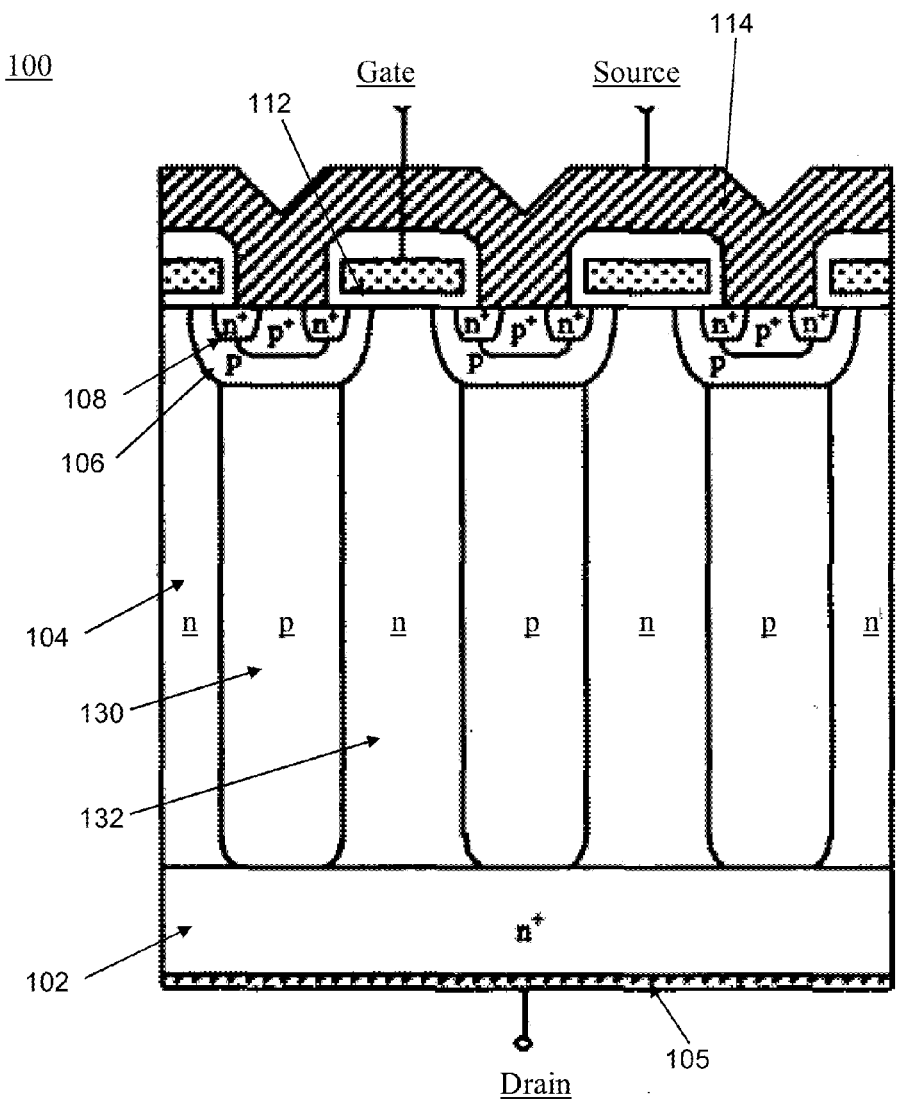
FIG. 1A is a diagram of a prior art superjunction device.
Figure 1B:
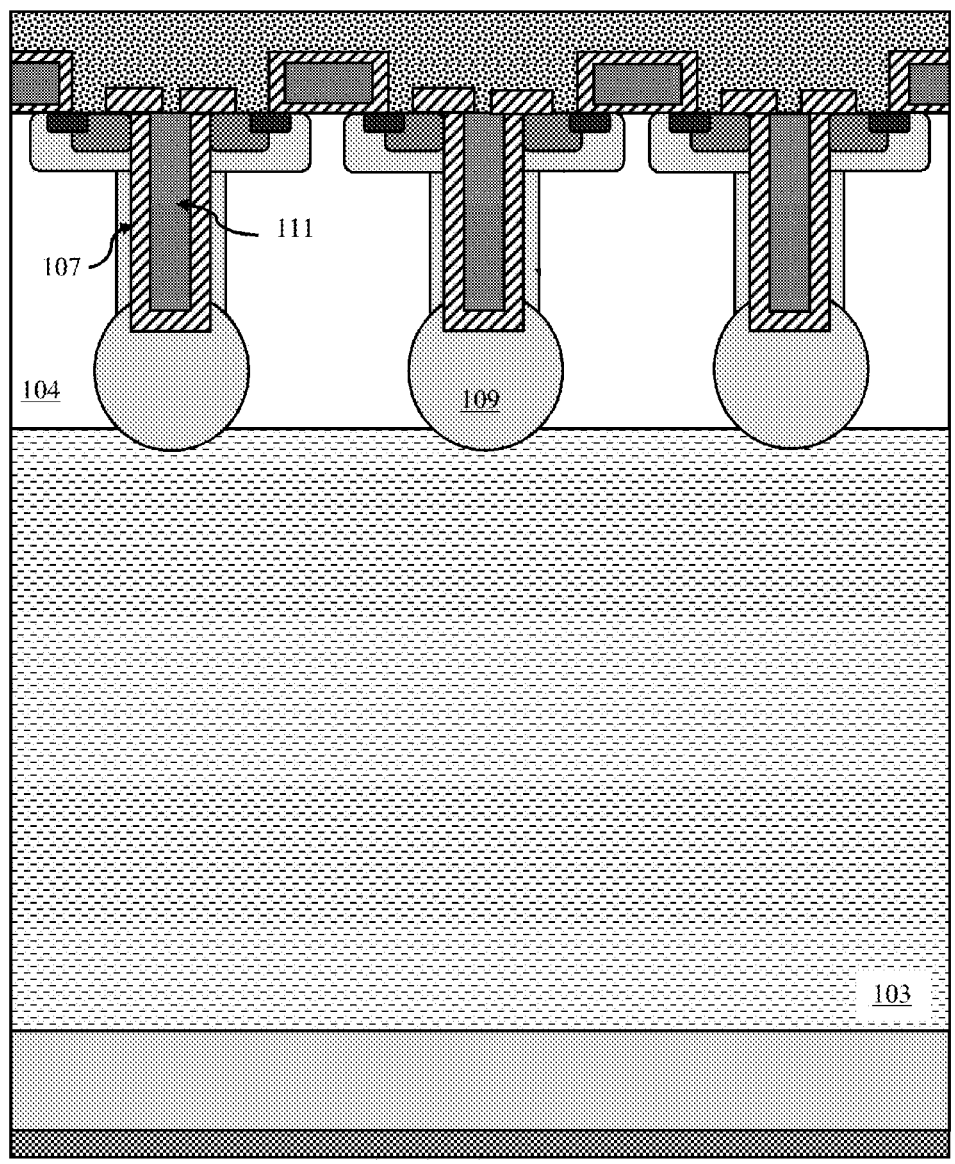
FIG. 1B is a diagram of an FBM device.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Introduction The unique design of a field balance metal oxide field effect transistor (FBM) has been shown to significantly increase the BV of a device while only increasing $R_{dsA}$ minimally. FIG. 1B provides the basic structure of an FBM device 101. In an FBM device the BV is split between a surface shielded region 104 and a voltage blocking region 103. By way of example and not by way of limitation, an FBM device designed to have a BV of 660 V may have the surface shielded region 104 support 140 V and the voltage blocking region 103 may support 520 V. The voltage blocking region 103 functions as a traditional epitaxial (epi-) layer and follows the relationship of $R_{dsA}$ a $BV^{2.5}$. Therefore, the proportional decrease in $R_{dsA}$ of the device as a result of decreasing the voltage supported by the voltage blocking region 103 from 660 V to 520 V is: $(660/520)^{2.5}=1.81$. For example, if the $R_{dsA}$ of a device was originally 82 mΩ.cm² for an epi-layer that must support the entire 660 V, then for a voltage blocking region 103 that only needs to support 520 V, the reduced $R_{dsA}$ would be only 45.2 mΩ.cm².

The surface shielded region 104 is configured to support the remaining voltage, while only adding a negligible amount of resistance. In order to accomplish this, the surface shielded region 104 is highly doped in order to minimize $R_{dsA}$. However, with a high doping concentration, the epi-layer alone cannot support enough voltage. Therefore, the surface shielded region 104 needs to be charge compensated. The charge compensation is provided by two separate components: (1) a MOS capacitor created by the oxide 107 surrounding the shield electrode 111; and (2) the buried P-region 109. Both components can be configured such that they each support the desired amount of the voltage. By way of example and not by way of limitation, the voltage supported by the surface shielded region 104 may be half supported by the buried P-region 109 and half supported by the oxide 107. FBM devices are described in greater detail in the commonly assigned patent application Ser. No. 13/561,523, which was incorporated herein by reference above.

The use of an FBM device allows for a higher breakdown voltage BV for a given $R_{dsA}$ than a conventional MOSFET device, but the FBM structure itself does not prevent the reduction of BV at localized spots. Specifically, the BV at the edge of a device die is typically much lower than the BV that can be supported by the drift layer. Termination structures are used in order to minimize the peak electric field at the edges of the device in order to decrease the effects of localized breakdown.

Figure 2:
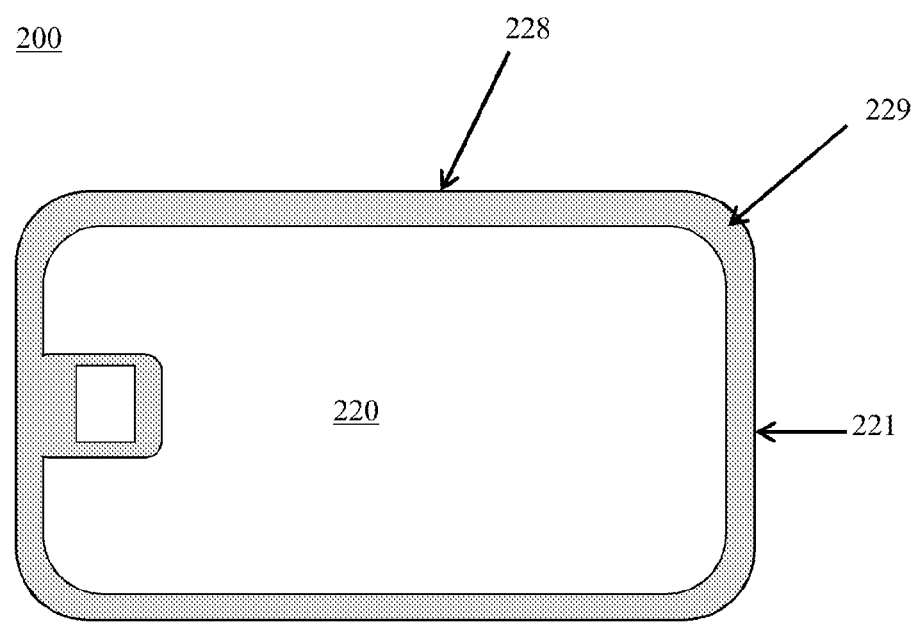
FIG. 2 is a top view of a device die showing the active area and the termination region according to an embodiment of the present invention.

The effects of localized breakdown can be understood by referring to FIG. 2, which shows a top view of a device die 200 having an active area 220 and a termination region 221 as shown in FIG. 2. Charge balanced and surface enhanced devices may provide an increase in the BV of the devices in the active area 220, but the structures alone do not protect against localized decreases in the BV. These localized locations are commonly seen at the corners 229 and edges 228 of the device die 200. With respect to superjunction type devices, the corners 229 present areas of localized breakdown because it is difficult to balance the charges resulting from the alternating columns. An area with an unbalanced charge prevents the columns from fully depleting and therefore they cannot sustain the entire theoretical BV. With respect to an FBM type device the corners 229 present areas of localized breakdown because the geometry of the devices with respect to the termination region causes the electric field to vary greatly compared to electric field in the remainder of the device. Regardless of how high the theoretical BV is for a given high power MOSFET, the device's actual BV tends to be limited by the reduced BV at these localized areas.

Embodiments of the present invention address the problems associated with localized breakdown by engineering the layout of the devices in regions subject to localized breakdown.

A first embodiment of the present invention is directed at a corner layout in which the end of each striped cell array is optimally spaced away from the first termination device structure in the termination region. Analytically determining the optimum spacing between each striped cell array would be overly cumbersome and impractical. However, by utilizing proper engineering assumptions it is possible to reduce the number of spacing arrangements to around 100 possibilities, which can then be fabricated on a single wafer. Once fabricated, each arrangement can be tested and a BV of approximately 90% of the ideal BV can then be achieved using this technique.

A second embodiment of the present invention forms the active device structures using two types of striped cell arrays within the active cell region. The first type of striped cell array is a conventional striped cell array. A conventional striped cell array consists of active device structures being formed in a row. Each row begins near one edge of the active device region and continues across the active region till it approaches the edge on the opposite side. The rows end before intersecting the termination region, but they are oriented such that they are perpendicular to the termination region. The first type of striped cell array includes cells that are relatively straight and oriented parallel to each other. The second type of striped cell array structure consists of a conventional striped cell array with arcuate portions on each end. The second type of striped cell array is used in the areas proximate to the corner region. The arcuate portions generally follow the shape of nearby arcuate portions of the corner termination region such that a constant spacing is maintained between the second type striped cells and the nearby corner termination region. For example, if the corner regions of the termination region are in the shape of a quarter circles, the arcuate portions of nearby second type striped cells may be formed as concentric quarter circles. The outermost arcuate portion maintains a constant spacing with respect to the termination region. With this configuration the number of calculations needed to find the optimum spacing can be greatly reduced, and a BV that approaches nearly 100% of the theoretical BV is potentially achievable.

A third embodiment of the present invention uses conventional striped cell arrays in the active region. However, instead of calculating the proper spacing between the end of each striped cell array and the termination region, the devices in the termination region are formed such that they have spurs that adjust the spacing between the two regions. Analytically determining the design of the spurs at the end of each striped cell array would be overly cumbersome and impractical. However, by utilizing proper engineering assumptions it is possible to reduce the number of spacing arrangements to around 100 possibilities, which can then be fabricated on a single wafer. Once fabricated, each arrangement can be tested and a BV of approximately 90% of the ideal BV can then be achieved using this technique.

Specific Embodiments

Figure 3A:
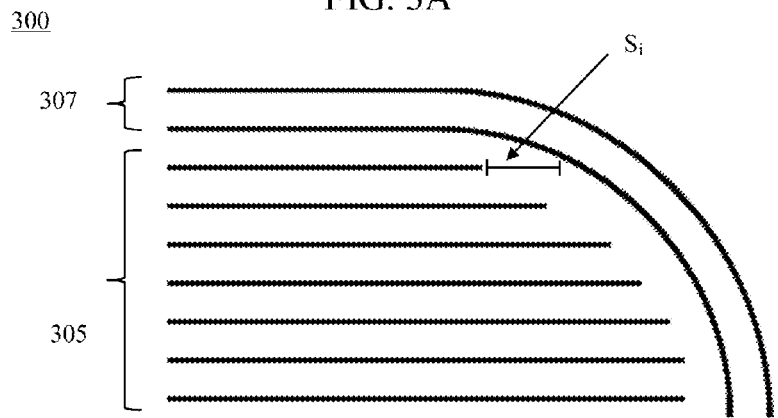
FIG. 3A is a top view of a corner layout for a first embodiment of the present invention.

A first embodiment of the present invention is directed at a corner layout for a high voltage MOSFET device utilizing active device structures formed in a striped cell array. FIG. 3A depicts a corner region 229 of the active area 220 of a device die 300. The active device structures are formed in striped cell arrays 305. By way of example and not by way of limitation, the striped cell array 305 can be used in conjunction with charge balance structures such as superjunction devices or with trench based structures such as FBM devices. With respect to superjunction structures, the black stripes represent columns doped with a second conductivity type dopant (i.e., P-type) and the white stripes represent the columns doped with a first conductivity type dopant (i.e., N-type). With respect to trench based structures, the black stripes represent the vertical trench portion of the device. The remaining portions of the device structure are omitted from the drawings for clarity.

In the termination region 221 the termination device structures are formed in concentric termination ring arrays 307 that surround the perimeter of the active area 220. The termination ring arrays 307 continue outwards until they reach the edge of the device die. As shown in FIG. 3A the space between the end of each striped cell array 305 and the first termination ring array 307 is represented by the distance $S_i$. In order to optimize the BV of the device, the exact distance of $S_i$ must be independently calculated for each striped cell array 305 proximate to the corner region. The value of $S_i$ for each striped cell array 305 that is oriented at a right angle to the termination ring arrays 307 is constant.

Finding the optimum spacing $S_i$ between each striped cell 305 and the first termination ring 307 would require overly cumbersome calculations. However, proper engineering assumptions may be made in order to reduce the complexity of this design problem. Engineering assumptions can be used to eliminate possible distance for $S_i$ that one skilled in the art would know is not a workable solution.

For example, with respect to the design for a trench based structure, if the spacing $S_i$ is too large, then the device will not be able to fully deplete and therefore cannot support the theoretical BV of the device. Therefore, any arrangement of the devices where $S_i$ is such that the device would not be able to fully deplete may be eliminated. Additionally, making the spacing $S_i$ too small will make the device deplete too fast. This will result in the voltage blocking layer being forced to support too much of the BV and the device will fail. Therefore, devices with an $S_i$ larger or smaller than a distance that blocks a desired voltage may be eliminated.

Once the required number of computations has been reduced, a device test wafer may be made. Through the process of elimination described above, the design engineer may reduce the number of spacing variations between each striped array 305 and the termination ring 307 to around 100 possible solutions. These potential solutions can be fabricated onto a test wafer and each solution may be tested in order to determine which one produces the highest BV. Although this methodology might not yield an ideal layout capable of sustaining the theoretical maximum for BV, it is capable of producing a solution that can sustain approximately 90% of the theoretical BV. After a first run, additional iterations can be performed to improve the BV even further.

Figure 3B:
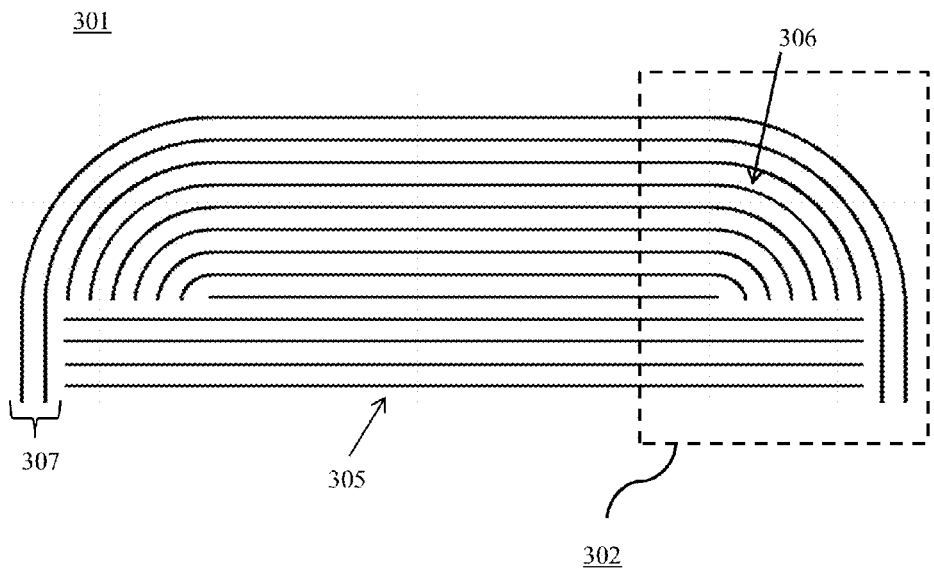
FIG. 3B is a top view of a corner layout for a second embodiment of the present invention.

FIG. 3B depicts a second embodiment of the present invention directed at a corner layout for high voltage MOSFET device 301 utilizing active device structures formed in straight striped cell arrays 305 and in a striped cell arrays with arcuate ends 306. By utilizing two different array configurations within the active zone, the number of calculations required to optimize the BV can be reduced.

In this embodiment, straight striped cell arrays 305 are used in parts of the active region 220 that are not proximate a corner 229. Each straight striped cell array begins near one edge of the active region 220 and continues across the active region 220 until it approaches the edge on the opposite side. The ends of the striped cell arrays 305 are spaced away from the first termination ring 307 by a distance $S_A$ (shown in FIG. 3C). The straight striped cell arrays 305 are oriented parallel to each other and they are oriented perpendicular to the portion of the termination rings 307 proximate the ends of the straight striped cell arrays 305.

FIG. 3C illustrates the corner portion 302 of FIG. 3B. As seen in FIGS. 3B-3C, the striped cell arrays proximate the corner regions 229 are straight over part of their length and also include arcuate portions 306 near their ends that are concentric with the curvature of the termination rings in the corner regions 229. The arcuate portions 306 are concentric wherein, an outermost arcuate portion 306 is located closest to the termination rings 307 and an innermost arcuate portion 306 is located furthest from the termination rings 307. By way of example and not by way of limitation, the arcuate portion 306 may be shaped as a quarter circle. The termination rings 307 in the present embodiment match the curvature of the arcuate portions 306. This allows for a constant spacing, $S_B$, between the outermost striped cell array 305 and the innermost termination ring 307. $S_B$ is equal to the cell pitch if the active array.

Each end of an arcuate portion 306 is oriented such that it would intercept the outermost unaltered striped cell 305 at an angle of 90°. For clarity, it should be noted that none of the striped cell arrays in the active region 220 actually intersect. The spacing between the ends of the arcuate portions 306 of the outermost unaltered striped cell array 305 is defined as $S_C$.

According to some embodiments of the present invention an intermediate striped cell array 305' may be used in order to further optimize the BV of the device. The intermediate striped cell array 305' extends approximately from the origin of the arcuate portions 306 of one corner and extends across the active area until it reaches the origin of the arcuate portions 306 on the opposite corner. The distance $S_D$ defines the spacing between the intermediate striped cell array 305' and the innermost striped cell array 305 with an arcuate portion 306.

The present embodiment only requires four unique spacing determinations $S_A$, $S_B$, $S_C$, and $S_D$. With a limited number of possibilities, the calculations are not as complex and an optimal design can be found by running a limited number of process and device (e.g., TCAD) simulations. This embodiment is therefore capable of producing a BV that is capable of achieving the theoretical maximum.

FIG. 3C depicts a third embodiment of the present invention directed at a corner layout for a high voltage MOSFET device utilizing active device structures formed in a striped cell array. FIG. 3C depicts a corner region 229 of the active area 220 of a device die 303. The striped cell arrays 305 are arranged substantially similar to the striped cell arrays in the first embodiment. In the termination region 221 the termination device structures are formed in concentric termination ring arrays 307 which surround the perimeter of the active area 220 and continue to the edge of the device die. Additionally, the innermost termination ring 307 has small spurs 308 projecting in towards the active area 220. With respect to the trench based devices, the spurs 308 are trenches, and with respect to a superjunction type device, the spurs 308 are suitably doped columns which will balance the charge in the region.

As shown in FIG. 3D the space between the end of each spur 308 and the nearest striped cell array 305 is represented by the distance $S_i$. In order to optimize the BV of the device, the exact distance of $S_i$ must be independently calculated for each spur 308 proximate to the corner region. It should be noted that the number of spurs 308 proximate to each striped cell array may be varied.

Finding the optimum number of spurs 308 and the optimum spacing $S_i$ between each spur 308 and the nearest striped cell array 305 might require overly cumbersome calculations. In order to reduce the complexity of this design problem proper engineering assumptions may be made. Assumptions are used to eliminate possible distances for $S_i$ that one skilled in the art would know is not a workable solution.

For example, with respect to the design for a trench based type structure, if the spacing $S_i$ is too large, then the device will not be able to fully deplete and therefore cannot support the theoretical BV of the device. Therefore, any arrangement of the devices where $S_i$ is such that the device would not be able to fully deplete may be eliminated. Additionally, making the spacing $S_i$ too small will make the device deplete too fast. This will result in the voltage blocking layer being forced to support too much of the BV and the device will fail. Therefore, devices with an $S_i$ larger or smaller than a distance that blocks a desired voltage may be eliminated.

Once the required number of computations has been reduced, a device test wafer may be made. Through the process of elimination described above, the design engineer is able to reduce the number of spacing variations between each spur 308 and the striped cell array 305 to around 100 possible solutions. These potential solutions are fabricated onto a test wafer and each solution is tested in order to determine which one produces the highest BV. This methodology will not yield a layout capable of supporting the theoretical maximum for BV, but it is capable of producing a solution capable of supporting approximately 90% of the theoretical BV. After a first run, additional iterations may be performed to improve the BV even further.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶116.

What is claimed is:

1. A semiconductor device comprising:
   a doped layer;
   an active cell region formed in the doped layer, the active cell region having a plurality of active cell device structures arranged in striped cell arrays, wherein each striped cell array having a first end and a second end; and
   a termination region having a plurality of termination device structures formed in the doped layer surrounding the active cell region,
      wherein a first subset of the striped cell arrays are configured to maximize a breakdown voltage of the semiconductor device by having the first and second ends of each striped cell array in the first subset spaced a uniform distance from a nearest termination device structure; and
      wherein a second subset of the striped cell arrays proximate to a corner region of the active cell region are configured to maximize the breakdown voltage by spacing the first and second ends of each striped cell array in the second subset a non-uniform distance from the nearest termination device structure, wherein the second subset of the striped cell arrays include arcuate end portions in the shape of quarter circles.

2. The device of claim 1, wherein the first and second ends of each of the striped cell arrays in the second subset are spaced a uniform distance from a nearest striped cell array in the first subset.

3. The device of claim 1, wherein the first and second ends of an outermost striped cell array of the second subset are spaced further away from the nearest termination device structure than the first and second ends of the striped cell arrays in the first subset.

4. The device of claim 1, wherein the termination device structures proximate the corner region include arcuate portions that are concentric with the arcuate end portions of the second subset of the striped cell arrays.

5. The device of claim 1, wherein the termination device structures are arranged in concentric ring arrays.

6. The device of claim 5, wherein an innermost ring array of termination device structures has a plurality of spurs extending inward towards the active cell region and wherein a distance between each of the spurs and a nearby striped cell array in the second subset is configured to maximize the breakdown voltage of the device.

7. A method of forming a semiconductor device, comprising:
   forming a doped layer;
   forming an active cell region in the doped layer, the active cell region having a plurality of active cell device structures arranged as striped cell arrays, each striped cell array having a first end and a second end; and
   forming a termination region having a plurality of termination device structures formed in the doped layer surrounding the active cell region,
      wherein a first subset of the striped cell arrays are configured to maximize a breakdown voltage of the semiconductor device by having the first and second ends of each striped cell array spaced a uniform distance from a nearest termination device structure; and
      wherein a second subset of the striped cell arrays proximate to a corner region of the active cell region are configured to maximize the breakdown voltage by spacing the first and second ends of each striped cell array in the second subset a non-uniform distance from the nearest termination device structure, wherein the striped cell arrays of the second subset include arcuate end portions configured as concentric quarter circles.

8. The method of claim 7, wherein the first and second ends of each of the striped cell array in the second subset include are spaced a uniform distance from a nearest striped cell array in the first subset.

9. The method of claim 7, wherein the first and second ends of an outermost striped cell array of the second subset are formed further away from the nearest termination device structure than the first and second ends of the other striped cell arrays in the first subset.

10. The method of claim 7, wherein the termination device structures proximate the corner region include arcuate portions that are concentric with the arcuate end portions of the striped cell arrays of the second subset.

11. The method of claim 7, wherein the termination device structures are arranged in concentric ring arrays.

12. The method of claim 11, wherein an innermost ring array of termination device structures has a plurality of spurs extending inward towards the active cell region, wherein a distance between each of the spurs and a nearby striped cell array in the second subset is configured to maximize the breakdown voltage of the device.

\* \* \* \* \*